United States Patent [19]

Huehne

[11] Patent Number: 5,113,095
[45] Date of Patent: May 12, 1992

[54] BICMOS LOGIC CIRCUIT WITH A CML OUTPUT

[75] Inventor: Karl J. Huehne, Austin, Tex.

[73] Assignee: Motorola, Inc., Schaumburg, Ill.

[21] Appl. No.: 675,042

[22] Filed: Mar. 25, 1991

Related U.S. Application Data

[63] Continuation-in-part of Ser. No. 574,178, Aug. 29, 1990, abandoned.

[51] Int. Cl.[5] .................. H03K 19/02; H03K 19/0175
[52] U.S. Cl. ..................................... 307/446; 307/475; 307/455
[58] Field of Search ................ 307/446, 475, 570, 455

[56] References Cited

U.S. PATENT DOCUMENTS

| | | | |
|---|---|---|---|
| 4,546,272 | 10/1985 | Suzuki et al. | 307/455 |
| 4,800,303 | 1/1989 | Graham et al. | 307/475 |
| 4,918,640 | 4/1990 | Heimsch et al. | 307/570 |
| 4,939,478 | 7/1990 | Heimsch et al. | 307/475 |
| 5,001,370 | 3/1991 | Phan et al. | 307/475 |

OTHER PUBLICATIONS

"Hot-Carrier Degradation in Bipolar Transistors at 300 and 110K—Effect on BiCMOS Inverter Performance", IEEE Transactions on Electron Devices, vol. 37, No. 4, Apr. 1990, pp. 1171-1173.

Motorola MECL System Design Handbook, No. HB205R1, pp. 10-11.

Primary Examiner—David Hudspeth
Assistant Examiner—Andrew Sanders
Attorney, Agent, or Firm—Paul J. Polansky

[57] ABSTRACT

A logic circuit for receiving both CMOS- and CML-level input voltages in one embodiment performs a logical OR function. A reference bipolar transistor is coupled to a first power supply voltage terminal through a first resistor. A second bipolar transistor for receiving a CML-level input signal is coupled to the first power supply voltage terminal through a second resistor. Emitters of the bipolar transistors are connected together. A MOS transistor for receiving a CMOS-level input signal has a drain connected to a collector of the second bipolar transistor, and a voltage dropping portion separates the source of the MOS transistor from the emitters of the reference transistor and the bipolar transistor. The input voltages control a constant current conducted from a current source connected to the source of the MOS transistor. The logic circuit allows mixed logic levels without subjecting the bipolar transistors to a large base-to-emitter reverse bias caused by CMOS logic levels.

19 Claims, 4 Drawing Sheets

BICMOS LOGIC CIRCUIT WITH A CML OUTPUT

This application is a continuation-in-part of prior application Ser. No. 07/574,178, filed Aug. 29, 1990 now abandoned.

FIELD OF THE INVENTION

This invention relates generally to logic circuits, and more particularly, to BICMOS logic circuits for receiving at least one CMOS-level input signal and for providing a CML-level output signal.

BACKGROUND OF THE INVENTION

One type of integrated circuit logic which uses bipolar transistors is called emitter-coupled logic (ECL). ECL logic circuitry has the advantages that it is very fast, and has high input resistance, low output resistance, and low noise generation. ECL signal levels, referenced to a power supply voltage terminal commonly labelled $V_{CC}$, are approximately $(V_{CC}-V_{BE})$ for a logic high voltage, and $(V_{CC}-2V_{BE})$ for a logic low voltage, where $V_{BE}$ is the forward biased base-emitter diode voltage drop or a corresponding bipolar transistor. In order to provide the logic high voltage $(V_{CC}-V_{BE})$, however, an extra transistor is necessary. A similar type of logic using bipolar transistors known as current-mode logic (CML) eliminates the need for an extra transistor by providing a logic high voltage of $V_{CC}$, and a logic low voltage of approximately $(V_{CC}-V_{BE})$. The output level is thus more constrained but in many cases the saving of a transistor is advantageous.

Metal oxide semiconductor (MOS) transistors are now commonly being fabricated in integrated circuits along with bipolar transistors. As a result, some logic circuits providing CML-level output signals are required to receive at least one input signal compatible with the MOS transistors in addition to receiving at least one CML-level input signal. Complementary metal oxide semiconductor (CMOS) signal levels differ from ECL and CML signal levels. A CMOS logic high voltage is approximately $V_{CC}$, whereas a logic low voltage is approximately a second power supply voltage, commonly labelled "$V_{SS}$", which is negative with respect to $V_{CC}$. However when CMOS levels are applied to a base of a bipolar transistor in a CML logic circuit, reliability problems can result because of the differences in logic levels. A large reverse bias which occurs if a CMOS logic low voltage (about $V_{SS}$) is applied to the base of an input bipolar transistor while the emitter is held at or near a CML logic high voltage ($V_{CC}$) is harmful to the operation of the input bipolar transistor. When a large reverse bias is applied across the base-emitter junction of a bipolar transistor, degradation occurs. Over time, the constant application of this large reverse bias may cause the input bipolar transistor to fail, resulting in a failure of the entire integrated circuit. Electronically, a large reverse bias on a PN junction causes hot carrier injection into the overlying oxide, resulting in poor junction performance. See, for example, "Hot-Carrier Degradation in Bipolar Transistor at 300 and 110 K—Effect on BiCMOS Inverter Performance", by Burnett and Hu in *IEEE Transactions on Electron Devices*, vol. 37, no. 4, April 1990, pp. 1171-1173. The amount of hot carrier injection is proportional to the time the reverse bias occurs. The size of the reverse bias is related to the mean life of the transistor, for given worst case conditions, by an inverse semi-logarithmic relationship; as the reverse bias decreases linearly, mean life increases exponentially. At typical values for reverse bias, transistor mean life in a mixed CML-CMOS logic circuit may be unacceptably short.

DESCRIPTION OF THE PREFERRED EMBODIMENT

Accordingly, there is provided, in one form a logic circuit for performing a predetermined logic operation on at least one in put signal of a predetermined logic level and a CMOS-level signal comprising an input transistor, a reference transistor, a current source, voltage dropping means, and an MOS transistor. The input transistor has a collector, a base for receiving an input signal of the predetermined logic level, and an emitter. The reference transistor has a collector, a base for receiving a reference voltage, and an emitter coupled to the emitter of the input transistor. The current source is coupled to a first power supply voltage terminal. The voltage dropping means provides a voltage differential between first and second terminals thereof, the first terminal of the voltage dropping means coupled to the emitters of the input transistor and the reference transistor. The MOS transistor has a first current electrode coupled to the collector of the input transistor, a gate for receiving the CMOS-level signal, and a second current electrode coupled to the second terminal of the voltage dropping means.

There is provided, in another form, a logic circuit comprising first and second resistors, a reference bipolar transistor, a current source, means for providing a voltage differential between an emitter of the reference bipolar transistor and the current source, and at least one MOS transistor. The first resistor has a first terminal coupled to a first power supply voltage terminal, and a second terminal. The second resistor has a first terminal coupled to the first power supply voltage terminal, and a second terminal. The reference bipolar transistor has a collector coupled to the second terminal of the second resistor and providing an output signal thereon, a base for receiving a reference voltage, and an emitter. The current source is coupled to a second power supply voltage terminal. Each MOS transistor has a first current electrode coupled to the second terminal of the first resistor, a gate for receiving an input voltage of predetermined logic level, and a second current electrode coupled to the current source. In one embodiment, the logic circuit further comprises at least one additional bipolar transistor. Each additional bipolar transistor has a collector coupled to the second terminal of the first resistor, a base for receiving a second input voltage of predetermined logic level, and an emitter coupled to the emitter of the reference bipolar transistor.

These and other objects, features and advantages will be more clearly understood from the following detailed description taken in conjunction with the accompanying drawings.

DETAILED DESCRIPTION OF THE INVENTION

Figure 1:
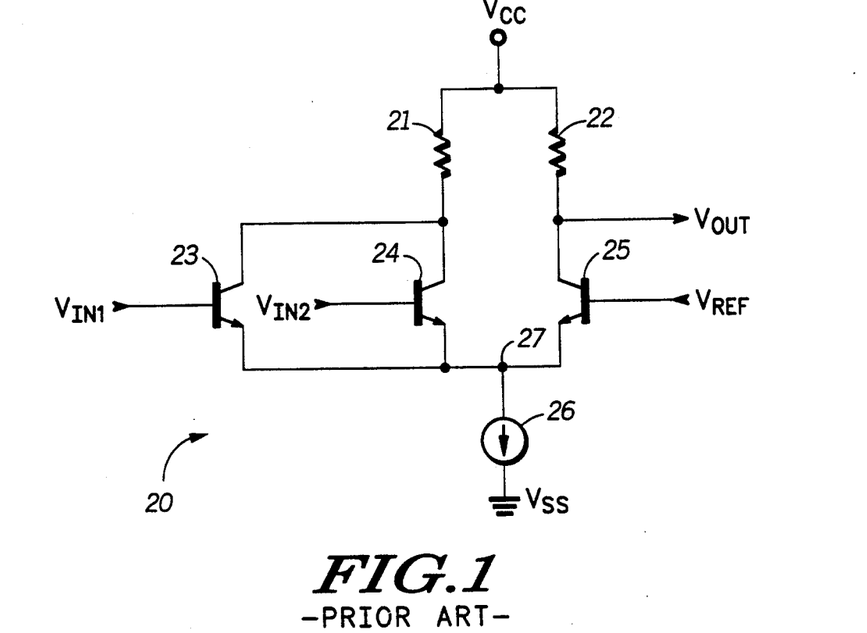
FIG. 1 illustrates in schematic form a known logic circuit.

FIG. 1 illustrates in schematic form a known logic circuit 20. Logic circuit 20 comprises resistors 21 and 22, NPN transistors 23, 24, and 25, and a current source 26. Resistor 21 has a first terminal connected to a positive power supply voltage terminal labelled "$V_{CC}$", and a second terminal. Resistor 22 has a first terminal connected to $V_{CC}$, and a second terminal. Transistor 23 has a collector connected to the second terminal of resistor 21, a base for receiving an input signal labelled "$V_{IN1}$", and an emitter connected to a node 27. Transistor 24 has a collector connected to the second terminal of resistor 21, a base for receiving a second input signal labelled "$V_{IN2}$", and an emitter connected to the emitter of transistor 23 at node 27. Transistor 25 has a collector connected to the second terminal of resistor 22 and providing an output signal labelled "$V_{OUT}$" thereon, a base for receiving a reference voltage labelled "$V_{REF}$", and an emitter connected to the emitters of transistors 23 and 24 at node 27. Current source 26 has a first terminal connected to the emitters of transistors 23, 24, and 25 at node 27, and a second current electrode connected to a negative power supply voltage terminal labelled "$V_{SS}$". Current source 26 provides a constant current having a positive magnitude when designated as flowing from a terminal at a more-positive voltage to a terminal at less-positive voltage. In FIG. 1, the first terminal of current source 26 is more positive in voltage with respect to the second terminal of current source 26, and a positive current flows in the direction from the first terminal to the second terminal. Thus, current source 26 is designated generically rather than being specified as a current source or a current sink.

Circuit 20 is a logic OR gate providing signal $V_{OUT}$ as a logic OR of input signals $V_{IN1}$ and $V_{IN2}$ at CML signal levels. The logic high voltage of signal $V_{OUT}$ is equal to $V_{CC}$, and the logic low voltage is approximately equal to $(V_{CC} - I_{26}R_{22})$, where $I_{26}$ is equal to the constant current of current source 26, and $R_{22}$ is the resistance of resistor 22. $V_{REF}$ is a reference voltage set approximately halfway between $V_{CC}$ and $(V_{CC} - I_{26}R_{22})$. The values of signals $V_{IN1}$ and $V_{IN2}$ determine whether the logic voltage or the logic low voltage is provided on signal $V_{OUT}$. If either signal $V_{IN1}$ or signal $V_{IN2}$ or both exceeds $V_{REF}$ by a minimum amount, then the current of current source 26, $I_{26}$, is steered through the corresponding transistor or transistors and not through transistor 25. In that case resistor 22 pulls signal $V_{OUT}$ to approximately $V_{CC}$. If however signals $V_{IN1}$ and $V_{IN2}$ are both less than $V_{REF}$ by a minimum amount, then transistor 25 is relatively more conductive than transistors 23 and 24 and substantially all of $I_{26}$ flows through transistor 25, dropping signal $V_{OUT}$ to $(V_{CC} - I_{26}R_{22})$.

If either signal $V_{IN1}$ or signal $V_{IN2}$ is a CMOS-level signal, however, logic circuit 20 has a reliability problem. If signal $V_{IN1}$ is the CMOS-level signal, then the logic voltage is approximately $V_{CC}$, and the logic low voltage is approximately $V_{SS}$. $V_{REF}$ sets the voltage on the emitter of transistor 25 to $(V_{REF} - V_{BE})$, where $V_{BE}$ is the base-emitter diode voltage drop of transistor 25. Therefore a relatively large reverse bias may develop across the base-emitter junction of transistor 23, equal to approximately $(V_{REF} - V_{BE} - V_{SS})$. For typical applications, $V_{CC} = 5$ volts, $V_{SS} = 0$ volts, $V_{REF} = 4.85$ volts, and $V_{BE} = 0.85$ volts. Therefore, a reverse bias of approximately 4 volts is possible if signal $V_{IN1}$ is a CMOS-level input. The size of the reverse bias is related to the mean life of the transistor, for given worst case conditions, by an inverse semilogarithmic relationship; as the reverse bias decreases linearly, mean life increases exponentially. At a reverse bias of 4 volts when signal $V_{IN1}$ is a logic low of approximately $V_{SS}$, transistor 23 will have an unacceptably short mean life.

Figure 2:
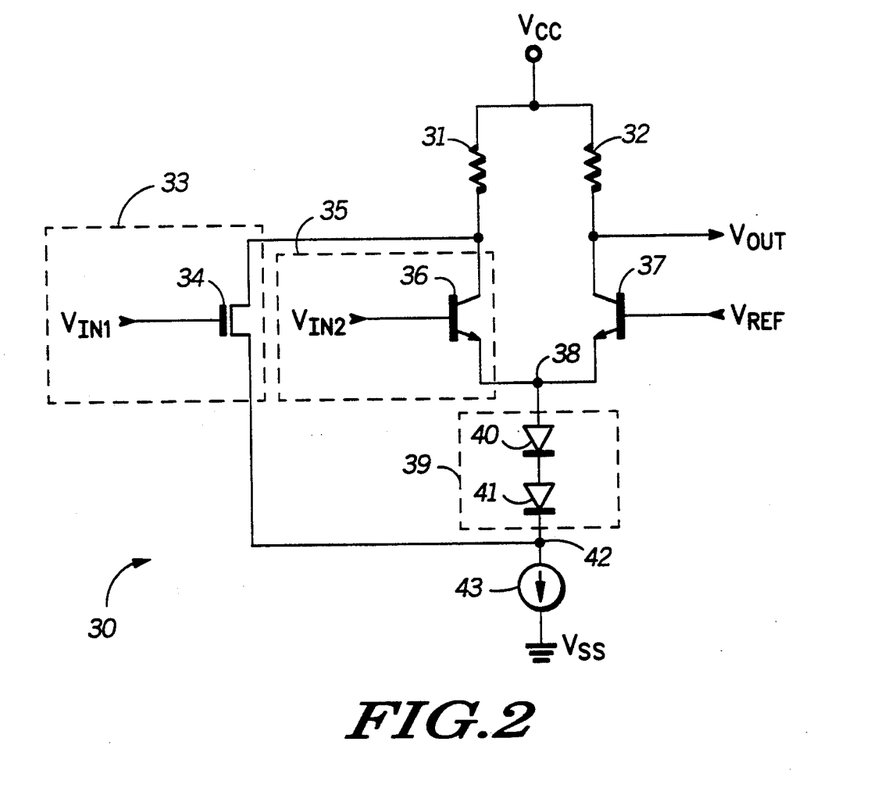
FIG. 2 illustrates in schematic form a logic circuit in accordance with the present invention.

FIG. 2 shows a logic circuit 30 in accordance with the present invention. Logic circuit 30 comprises resistors 31 and 32, a CMOS transistor portion 33, a bipolar transistor portion 35, an NPN reference transistor 37, voltage dropping portion 39, and a current source 43. In the illustrated embodiment, CMOS transistor portion 33 comprises an N-channel transistor 34, and bipolar transistor portion 35 comprises an NPN transistor 36. Voltage dropping portion 39 comprises diodes 40 and 41. Resistor 31 has a first terminal connected to $V_{CC}$, and a second terminal. Resistor 32 has a first terminal connected to $V_{CC}$, and a second terminal. Transistor 34 has a drain connected to the second terminal of resistor 31, a gate for receiving signal $V_{IN1}$, and a source connected to a node 42. Transistor 36 has a collector connected to the second terminal of resistor 31, a base for receiving signal $V_{IN2}$, and an emitter connected to a node 38. Transistor 37 has a collector connected to the second terminal of resistor 32 and providing signal $V_{OUT}$ thereon, a base for receiving $V_{REF}$, and an emitter connected to the emitter of transistor 36 at node 38. Diode 40 has a positive terminal connected to the emitters of transistors 36 and 37 at node 38, and a negative terminal. Diode 41 has a positive terminal connected to the negative terminal of diode 40, and a negative terminal connected to the source of transistor 34 at node 42. Current source 43 has a first terminal connected to the source of transistor 34 and to the negative terminal of diode 41 at node 42, and a second terminal connected to $V_{SS}$.

Logic circuit 30 is a two-input OR gate like logic circuit 20 of FIG. 1. In logic circuit 30, N-channel MOS transistor 34 in CMOS transistor portion 33 is used instead of an NPN bipolar transistor to receive the CMOS-level input signal $V_{IN1}$. Therefore, no bipolar transistor is subject to large reverse bias on its base-emitter junction due to the higher CMOS levels, like transistor 23 in FIG. 1. However instead of being connected to the emitters of transistors 36 and 37, the source of transistor 34 is separated by diodes 40 and 41, forming voltage dropping portion 39, from the emitters of transistors 36 and 37. At typical values for $V_{CC}$ and $V_{SS}$, 5.0 volts and 0 volts respectively, the voltage on node 38 ($V_{38}$) is equal to 4.0 volts. Then if transistor 34 were connected to the emitters of transistors 36 and 37, the source voltage would be set at 4.0 volts. The logic high voltage of signal $V_{IN1}$ is equal to approximately $V_{CC}$, or 5.0 volts. Thus the gate-to-source voltage ($V_{GS}$) of transistor 34 when signal $V_{IN1}$ is at a logic high would not exceed 1 volt. A $V_{GS}$ of 1 volt is insufficient to divert substantially all the current flowing through current source 43 ($I_{43}$) through transistor 34 without substantially reducing its threshold voltage, which may be possible only by making the gate size of transistor 34 extremely large. However in logic circuit 30, the voltage on the source of transistor 34 is reduced by two diode drops, or about 1.8 volts, from $V_{38}$. With typical values, then the voltage on the source of transistor 34 is at 2.2 volts, providing a $V_{GS}$ of transistor 34, when signal $V_{IN1}$ is a logic high, of 2.8 volts. The increased $V_{GS}$ is sufficient to divert substantially all the current of current source 43 through transistor 34.

Figure 3:
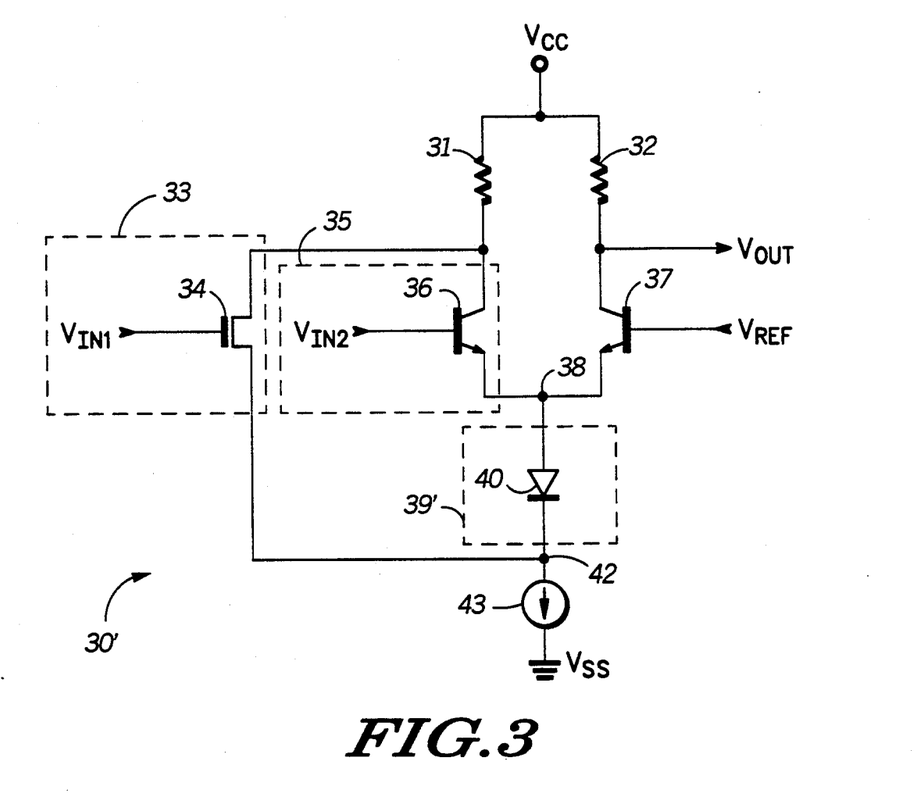
FIG. 3 illustrates in schematic form a second embodiment of the logic circuit of the present invention.

FIG. 3 shows an alternative embodiment 30' of logic circuit 30 of FIG. 2, which is useful when $V_{CC}$ is substantially less than 5 volts. For ease of illustration elements in common with FIG. 2 are similarly numbered. Each element is the same with the exception that voltage dropping portion 38' comprises a single diode 40 having a positive terminal connected to node 38, and a negative input terminal connected to the first terminal of current source 43 at node 42. If $V_{CC}$ is substantially less than 5 volts, circuit 30' is preferred. There is tradeoff between the $V_{GS}$ of transistor 34, and the gain of logic circuit 30'; if $V_{CC}$ is reduced well below 5 volts, then the tradeoff shifts in favor of having a lower $V_{GS}$ on transistor 34 when signal $V_{IN1}$ is a logic high, and an increased gain.

Returning now to FIG. 2, it should be apparent that other methods of dropping a voltage between node 38 and node 42 are possible including, but not limited to, using a resistor, using two bipolar transistors serially each with a collector connected to a base, and using two N-channel MOS transistors serially each with a drain connected to a gate. Also note that while a two-input OR gate was illustrated, OR gates with more inputs are possible by increasing the number of transistors in portions 33 and 35. For each additional CMOS input, an N-channel transistor having a drain connected to the second terminal of resistor 31, a gate for receiving the CMOS-level input signal, and a source connected to node 42 must be provided. For each additional CML-level input, an NPN transistor having a collector connected to the second terminal of resistor 31, a base for receiving the CML-level input signal, and an emitter connected to node 38 must be provided. It should also be noted that in another embodiment bipolar transistor portion 35 may be omitted. Then if only a single input is received on the gate of a MOS transistor in CMOS transistor portion 33, the function performed would be a level conversion from a CMOS-level input signal to a CML-level output signal. If further CMOS input signals were received, then the function performed would be a logical OR between each of the input signals.

Figure 4:
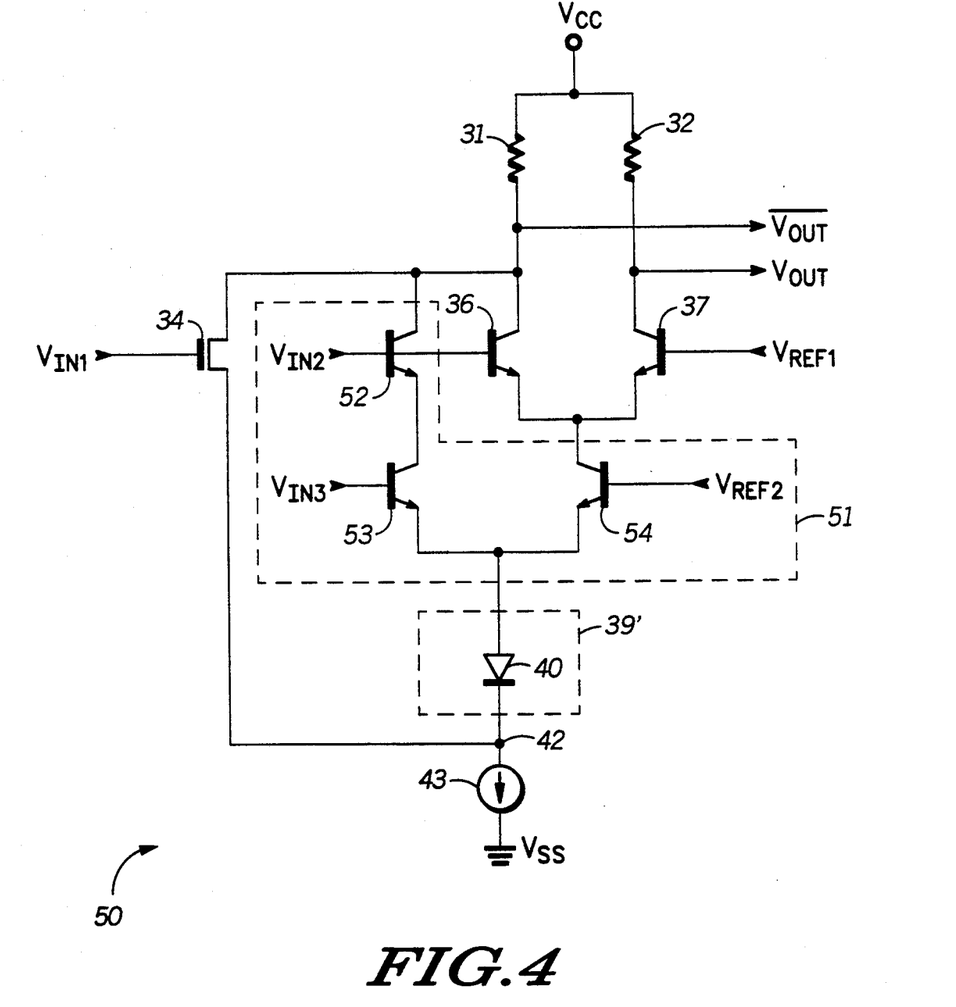
FIG. 4 illustrates in schematic form a third embodiment of the logic circuit of the present invention.

FIG. 4 illustrates in schematic form a logic circuit 50 in accordance with a third embodiment of the present invention. For ease of illustration elements in common with FIGS. 2 and 3 are similarly numbered. Logic circuit 50 includes resistors 31 and 32, N-channel transistor 34, NPN transistors 36 and 37, voltage dropping portion 39', and current source 43 as previously illustrated in FIG. 3. Resistor 31 has a first terminal connected to $V_{CC}$, and a second terminal for providing a signal labelled "$\overline{V_{OUT}}$". Resistor 32 has a first terminal connected to $V_{CC}$, and a second terminal for providing signal $V_{OUT}$. Transistor 34 had a drain connected to the second terminal of resistor 31, a gate for receiving signal $V_{IN1}$, and a source connected to node 42. Transistor 36 has a collector connected to the second terminal of resistor 31, a base for receiving signal $V_{IN2}$, and an emitter. Transistor 37 has a collector connected to the second terminal of resistor 32, a base for receiving a reference voltage labelled "$V_{REF1}$", and an emitter connected to the emitter of transistor 36. As in FIG. 3, voltage dropping portion 39' includes a single diode having a positive terminal, and a negative terminal connected to the source of transistor 34 at node 42. Current source 43 has a first terminal connected to the source of transistor 34 and to the negative terminal of diode 40 at node 42, and a second terminal connected to $V_{SS}$.

In logic circuit 50, however, the positive terminal of diode 40 is coupled to the emitters of transistors 36 and 37 through series gating stage 41. Series gate stage 51 includes NPN transistors 52, 53, and 54. Transistor 52 has a collector connected to the second terminal of resistor 31, a base for receiving signal $V_{IN2}$, and an emitter. Transistor 53 has a collector connected to the emitter of transistor 52, a base for receiving an input signal labelled "$V_{IN3}$", and an emitter connected to the positive terminal of diode 40. Transistor 54 has a collector connected to the emitters of transistors 36 and 37, a base for receiving a reference voltage labelled "$V_{REF2}$", and an emitter connected to the emitter of transistor 53 and to the positive terminal of diode 40.

Logic circuit 50 illustrates another embodiment of the present invention in which an additional logic operation is performed by coupling the emitters of transistors 36 and 37 to voltage dropping portion 39' through series gating stage 51. Series gating stage 51 adds an additional term to the logic function so that logic circuit 50 performs a logical OR of signals $V_{IN1}$, $V_{IN2}$, and $V_{IN3}$. As before, signal $V_{IN1}$ is a CMOS-level signal, with a logic high voltage of approximately $V_{CC}$ and a logic low voltage of approximately $V_{SS}$; $V_{IN2}$ is a CML-level signal with a logic high voltage of $V_{CC}$ and a logic low voltage of $(V_{CC}-I_{43}R_{32})$, where $R_{32}$ is the resistance of resistor 32; and $V_{IN3}$ is a signal with a logic high voltage of about $(V_{33}-I_{43}R_{32})$, and a logic low voltage of approximately $(V_{CC}-I_{43}R_{32}-V_{BE})$. Thus, $V_{IN3}$ has logic levels one $V_{BE}$ below CML signal levels (i.e., at ECL signal levels). $V_{REF1}$ is a reference voltage set approximately halfway between $V_{CC}$ and $(V_{CC}-I_{43}R_{32})$. However, $V_{REF2}$ is approximately one $V_{BE}$ below $V_{REF1}$ at $(V_{CC}-I_{43}R_{32}-V_{BE})$.

To understand the operation of logic circuit 50, first assume that signal $V_{IN3}$ is at a logic low of $(V_{CC}-I_{43}R_{32}-V_{BE})$. In this case, logic circuit 50 functions as if series gating portion 51 were absent. If $V_{IN1}$ is a logic high, then transistor 34 is conductive making $V_{OUT}$ a logic and $\overline{V_{OUT}}$ a logic low. If $V_{IN1}$ is a logic low, the transistor 34 is nonconductive, and operation depends on $V_{IN2}$. Since $V_{IN3}$ is less than $V_{REF2}$, transistor 53 is nonconductive, the voltage on the emitters of transistors 36 and 37 drops below the voltage on the emitter of transistor 52, and substantially all of $I_{43}$ is diverted through transistor 54. Then, if $N_{IN2}$ is at a logic high, transistor 36 is conductive and makes $V_{OUT}$ a logic high and $\overline{V_{OUT}}$ a logic low. If however $V_{IN2}$ is at a logic low, then $I_{43}$ is diverted through transistor 37, and $V_{OUT}$ is a logic low with $\overline{V_{OUT}}$ at a logic high.

Next, assume $V_{IN1}$ and $V_{IN2}$ are both a logic low. $V_{IN2}$, a CML-level signal, is at $(V_{CC}-I_{43}R_{32})$. Transistor 52 will remain nonconductive as long as the voltage at the emitter of transistor 52 is greater than $(V_{CC}-I_{43}R_{32}-V_{BE})$. If $V_{IN3}$ is at a logic low, then $I_{43}$ is diverted through transistor 54 at the series gating stage, and through transistor 37. Thus, $V_{OUT}$ is at a logic low. However, if $V_{IN3}$ is a logic high, at $(V_{CC}-V_{BE})$, then transistor 53 becomes conductive, and reduces the voltage at the emitter of transistor 52 to approximately $(V_{CC}-I_{43}R_{32}-V_{BE})$, making transistor 52 conductive. Thus, $I_{43}$ is diverted through transistors 53 and 52 which makes $V_{OUT}$ a logic high and $\overline{V_{OUT}}$ a logic low.

An important advantage to the inclusion of series gating stage 51 is that the capacitance on the second terminal of resistor 31, which provides signal $V_{OUT}$, is much less than if the extra term of the logic function were implemented by including a transistor in parallel with transistor 36. Thus, additional terms of the logical-OR function performed by logic circuit 50 may be included without additional capacitance loading on signal $V_{OUT}$. Obviously, if signal $V_{IN3}$ were available at the necessary lower logic levels, the use of series gating stage 51 would improve speed while only requiring extra transistors 53 and 54 (the base of transistor 52 would receive $V_{IN3}$, with the emitter of transistor 52 connected to the emitters of transistors 36 and 37). If $V_{IN3}$ were available only at CML logic levels, however, there would be a tradeoff between the additional circuitry required to drop the signal level of $V_{IN3}$ by one $V_{BE}$ and the improvement due to reduce capacitance on the second terminal of resistor 31.

Figure 5:
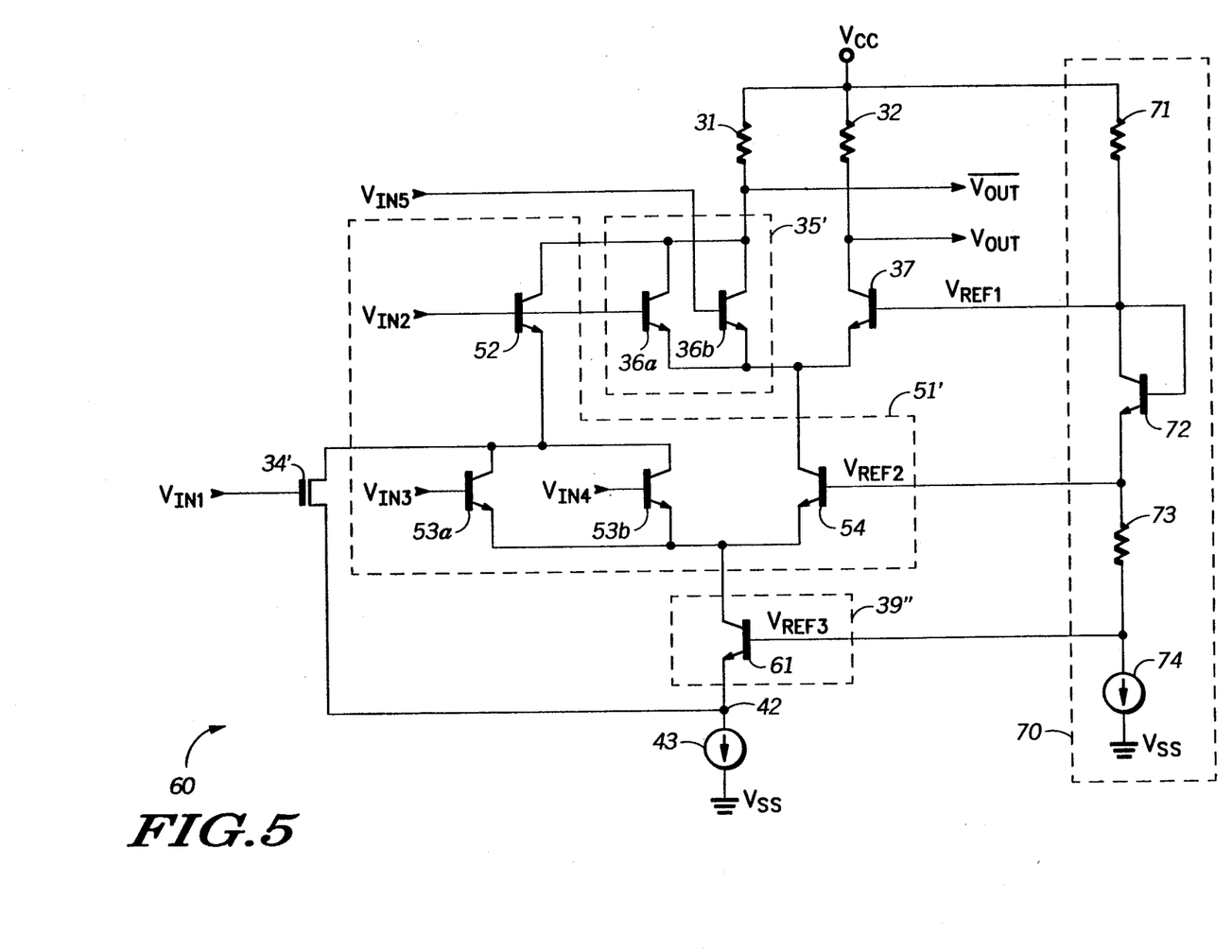
FIG. 5 illustrates in schematic form a logic circuit in accordance with a preferred embodiment of the present invention.

FIG. 5 illustrates in schematic form a logic circuit 60 in accordance with a preferred embodiment of the present invention. As before, elements in common with previous FIGS. will be similarly numbered. As in FIG. 4, logic circuit 60 includes resistors 31 and 32, NPN transistor 37, and current source 43. N-channel transistor 34' replaces transistor 34 of FIGS. 2-4. Bipolar transistor portion 35' replaces bipolar transistor portion 35 of FIGS. 2 and 3 and includes NPN transistor 36a and 36b. Series gating portion 51' replaces series gating portion 51 of FIG. 4 and includes NPN transistors 52, 53a, 53b, and 54. Voltage dropping portion 39'' replaces reference voltage portion 39 of FIG. 2 and 39' of FIGS. 3 and 4, and includes an NPN transistor 61. A reference voltage circuit 70 includes a resistor 71, an NPN transistor 72, a resistor 73, and a current source 74.

Resistor 31 has a first terminal connected to $V_{CC}$, and a second terminal for providing signal $V_{OUT}$. Resistor 32 has a first terminal connected to $V_{CC}$, and a second terminal for providing signal $\overline{V_{OUT}}$. In bipolar transistor portion 35', transistor 36a has a collector connected to the second terminal of resistor 31, a base for receiving signal $V_{IN2}$, and an emitter. Transistor 36b has a collector connected to the second terminal of resistor 31, a base for receiving an input signal labelled "$V_{IN5}$", and an emitter connected to the emitter of transistor 36a. Transistor 37 has a collector connected to the second terminal of resistor 32, a base for receiving signal $V_{REF1}$, and an emitter connected to the emitters of transistors 36a and 36b. In series gating portion 51', transistor 52 has a collector connected to the second terminal of resistor 31, a base for receiving signal $V_{IN2}$, and an emitter. Transistor 53a has a collector connected to the emitter of transistor 52, a base for receiving signal $V_{IN3}$, and an emitter. Transistor 53b has a collector connected to the emitter of transistor 52, a base for receiving a signal labelled "$V_{IN4}$", and an emitter connected to the emitter of transistor 53a. Transistor 54 has a collector connected to the emitters of transistors 36a, 36b, and 37, a base for receiving signal $V_{REF2}$, and an emitter connected to the emitters of transistors 53a and 53b. In voltage dropping portion 39'', transistor 61 has a collector connected to the emitters of transistors 53a, 53b, and 54, a base for receiving a signal labelled "$V_{REF3}$", and an emitter connected to node 42. Transistor 34' has a drain connected to the emitter of transistor 52, a gate for receiving signal $V_{IN1}$, and a source connected to the emitter of transistor 61 at node 42. Current source 43 has a first terminal connected to the emitter of transistor 61 and to the source of transistor 34' at node 42, and a second terminal connected to $V_{SS}$. In reference voltage circuit 70, resistor 71 has a first terminal connected to $V_{CC}$, and a second terminal for providing signal $V_{REF1}$. Transistor 72 has a collector connected to the second terminal of resistor 71, a base connected to the collector of transistor 72, and an emitter for providing signal $V_{REF2}$. Resistor 73 has a first terminal connected to the emitter of transistor 72, and a second terminal for providing signal $V_{REF3}$. Current source 74 has a first terminal connected to the second terminal of resistor 73, and a second terminal connected to $V_{SS}$.

There are three principal differences between logic circuit 60 and logic circuit 50 of FIG. 4, which are best understood by comparing the differences. First, logic circuit 60 performs a logical OR of five input signals. Of the five input signals, one ($V_{IN1}$) is a CMOS-level signal received by transistor 34'. Two signals ($V_{IN2}$ and $V_{IN5}$) are CML logic signals received by transistors 36a and 52, and 36b, respectively. Two others ($V_{IN3}$ and $V_{IN4}$) are ECL-level signals, or alternatively, CML-level signal reduced in voltage by $V_{BE}$, received by transistors 53a and 53b, respectively. Second, the drain of transistor 34' is connected to the emitter of transistor 52, rather than to the second terminal of resistor 31, to further reduce the capacitance on a critical output node providing $V_{OUT}$. Third, voltage dropping portion 39'' includes transistors 61. Instead of transistor 61 having its base connected to its collector, to function as a diode, its base receives signal $V_{REF3}$. $R_{REF3}$ is a voltage slightly greater than the voltage at the collector of transistor 39''. Increasing $V_{REF3}$ above the voltage at the collector of Transistor 61 allows transistor 61 to go into saturation and to provide operation at a lower voltage for $V_{CC}$.

In bias circuit 70, $V_{REF1}$ is provided at ($V_{CC} - I_{74}R_{71}$), a voltage which is about halfway between the CML signal swing from $V_{CC}$ to ($V_{CC} - I_{43}R_{32}$), where $I_{74}$ is the current of current source 73, and $R_{71}$ is the resistance of resistor 71. Transistor 72 is diode-connected to reduce voltage $V_{REF2}$ to an amount equal to the voltage at the second terminal of resistor 71 minus one $V_{BE}$. Resistor 73 further reduces the voltage to provide $V_{REF3}$ to transistor 61.

Logic circuit 60 thus provides the advantage that ECL-level logic signals may also be combined with CMOS- and CML-level signals while retaining the advantages of the present invention as previously described in connection with FIG. 3. Also, the extra logic inputs may be received without capacitively loading the second terminal of resistor 31, which may be a critical output node in certain applications. Additional CML-level input signals may be level-shifted downward by one $V_{BE}$ and received by transistors such as 52a to further offload the critical node. Thus, logic circuit 60 provides additional flexibility.

It should be apparent by now that a logic circuit for receiving at least one CMOS-level input signal and at least one CML-level input signal has been described. A bipolar transistor portion comprises at least one bipolar transistor each having a collector coupled through a first resistor to a first power supply voltage terminal, a base for receiving a respective CML-level input signal, and an emitter. A reference bipolar transistor has a collector connected to the first power supply voltage terminal through a second resistor, a base for receiving a reference voltage, and an emitter connected to the emitter of each transistor in the bipolar transistor portion. A CMOS transistor portion comprises at least one CMOS transistor each having a first current electrode connected to the first resistor, a gate for receiving a respective CMOS-level input signal, and a second current electrode. The second current electrode of the CMOS transistor is separated from the voltage on the emitters of the two bipolar transistors by, for example, two diode voltage drops. The bipolar and CMOS transistors steer a current provided by a current source to provide an output signal on the collector of the reference bipolar transistor.

While the invention has been described in the context of a preferred embodiment, it will be apparent to those skilled in the art that the present invention may be modified in numerous ways and may assume many embodiments other than that specifically set out and described above. For example, the conductivities of the transistors could be reversed and the circuit inverted to provide a different logic function. Accordingly, it is intended by the appended claims to cover all modifications of the invention which fall within the true spirit and scope of the invention.

I claim:

1. A logic circuit comprising:
    a first resistor having a first terminal coupled to a first power supply voltage terminal, and a second terminal;
    a second resistor having a first terminal coupled to said first power supply voltage terminal, and a second terminal;
    a reference bipolar transistor having a collector coupled to said second terminal of said second resistor for providing an output signal, a base for receiving a reference voltage, and an emitter;
    a second bipolar transistor having a collector coupled to said second terminal of said first resistor, a base for receiving a first input voltage of a predetermined logic level, and an emitter coupled to said emitter of said reference bipolar transistor;
    a current source coupled to a second power supply voltage terminal;
    means coupled to said current source for providing a voltage differential between said emitter of said reference bipolar transistor and said current source; and
    at least one MOS transistor, each of said at least one MOS transistor having a first current electrode coupled to said second terminal of said first resistor, a gate for receiving a second input voltage characterized as being a CMOS-level signal, and a second current electrode coupled to said current source.

2. The logic circuit of claim 1 wherein said means for providing a differential voltage further comprises:
    a first diode having a positive terminal coupled to said emitters of said reference and second bipolar transistors, and a negative terminal; and
    a second diode having a positive terminal coupled to said negative terminal of said first diode, and a negative terminal coupled to said current source.

3. The logic circuit of claim 1 wherein said means for providing a voltage differential further comprises a diode having a positive terminal coupled to said emitters of said reference and second bipolar transistors, and a negative terminal coupled to said current source.

4. The logic circuit of claim 1 wherein each of said at least one MOS transistor in an N-channel MOS transistor, and said reference and second bipolar transistors are NPN bipolar transistors.

5. A logic circuit comprising:
    a first bipolar transistor having a collector coupled to a first power supply voltage terminal through a first resistor, a base for receiving a first input signal, and an emitter;
    a second bipolar transistor having a collector coupled to said first power supply voltage terminal through a second resistor and providing an output signal thereon, a base for receiving a reference voltage signal, and an emitter coupled to said emitter of said first bipolar transistor;
    a current source coupled to a second power supply voltage terminal;
    means coupled to said current source for providing a voltage differential between said emitter of said first bipolar transistor and said current source; and
    an MOS transistor having a drain connected to said collector of said first transistor, a gate for receiving a second input signal, and a source coupled to said current source;
said first input signal characterized as being a CML-level signal, and said second input signal characterized as being a CMOS-level signal.

6. The logic circuit of claim 5 wherein said means for providing a voltage differential further comprises:
    a first diode having a positive terminal coupled to said emitters of said first and second bipolar transistors, and a negative terminal; and
    a second diode having a positive terminal coupled to said negative terminal of said first diode, and a negative terminal coupled to said current source.

7. The logic circuit of claim 5 wherein said means for providing a voltage differential further comprises a diode having a positive terminal coupled to said emitters of said first and second bipolar transistors, and a negative terminal coupled to said current source.

8. The logic circuit of claim 5 wherein said MOS transistor is an N-channel MOS transistor, and wherein said first and second bipolar transistors are both NPN bipolar transistors.

9. In a logic circuit for performing a predetermined logic operation on at least one CML-level signal and at least one CMOS-level signal comprising:
    a first resistor having a first terminal coupled to a first power supply voltage terminal, and a second terminal;
    a second resistor having a first terminal coupled to said first power supply voltage terminal, and a second terminal;
    a reference bipolar transistor having a collector coupled to said second terminal of said second resistor, a base for receiving a reference voltage, and an emitter;
    a current source coupled to a second power supply voltage terminal; and
    a second bipolar transistor having a collector coupled to said second terminal of said first resistor, a base for receiving a CML-level signal of the at least one CML-level signal, and an emitter coupled to said emitter of said reference bipolar transistor,
a method of increasing a mean life of said reference and second bipolar transistors, comprising the steps of:
    coupling a current conduction path of a MOS transistor between said second terminal of said first resistor and said current source, a gate of said MOS transistor receiving a CMOS-level signal of the at least one CMOS-level signal; and providing a voltage differential between said emitter of said reference bipolar transistor and said current source by an amount sufficient to coupled substantially all of a constant current of said current source through said MOS transistor in response to said input voltage of said second predetermined logic level exceeding said reference voltage.

10. The logic circuit of claim 1 wherein said means coupled to said current source comprises:
series gating means, coupled to said emitter of said reference bipolar transistor, for selectively diverting a current of said current source through said either said first resistor of said reference bipolar transistor in response to a second input signal; and
dropping means coupled to said series gating means and to said current source, and for dropping said differential voltage.

11. The logic circuit of claim 10 wherein said series gating means comprises:
a second bipolar transistor having a collector coupled to said second terminal of said first resistor, a base for receiving a third input signal, and an emitter;
a third bipolar transistor having a collector coupled to said emitter of said second bipolar transistor, a base for receiving said second input signal, and an emitter coupled to said dropping means; and
a fourth bipolar transistor having a collector coupled to said emitter of said reference bipolar transistor, a base for receiving a second reference voltage, and an emitter coupled to said emitter of said third bipolar transistor and to said current source.

12. A logic circuit comprising:
an input transistor having a collector, a base for receiving an input signal of a predetermined logic level, and an emitter;
a reference transistor having a collector, a base for receiving a reference voltage, and an emitter coupled to said emitter of said input transistor;
a current source coupled to a first power supply voltage terminal;
voltage dropping means for providing a voltage differential between first and second terminals thereof, said first terminal of said voltage dropping means coupled to said emitters of said input transistors and said reference transistor; and
an MOS transistor having a first current electrode coupled to said collector of said input transistor, a gate for receiving a CMOS-level signal, and a second current electrode coupled to said second terminal of said voltage dropping means.

13. The logic circuit of claim 12 further comprising:
a first resistor having a first terminal coupled to a second power supply voltage terminal, and a second terminal coupled to said collector of said input transistor; and
a second resistor having a first terminal coupled to said second power supply voltage terminal, and a second terminal coupled to said collector of said reference transistor.

14. The logic circuit of claim 12 wherein said first terminal of said voltage dropping means is coupled to said emitters of said input and reference transistors through a series gating stage, said series gating stage comprising:

a second input transistor having a collector coupled to the second terminal of the first resistor, a base for receiving said first input signal, and an emitter;
a third input transistor having a collector coupled to said emitter of said second input transistor, a base for receiving a second input signal, and an emitter coupled to said first terminal of said voltage dropping means; and
a second reference transistor having a collector coupled to said emitters of said first input transistor and said reference transistor, a base for receiving a second reference voltage, and an emitter coupled to said emitter of said third input transistor and to said first terminal of said voltage dropping means.

15. The logic circuit of claim 12 further comprising:
a second input transistor having a collector coupled through a first resistor to a second power supply voltage terminal, a base for receiving a second input signal, and an emitter coupled to said collector of said reference transistor;
a third input transistor having a collector coupled to said collector of said second input transistor, a base for receiving a third input signal, and an emitter coupled to said collector of said input transistor; and
a second reference transistor having a collector coupled through a second resistor to said second power supply voltage terminal, a base for receiving a second reference voltage, and an emitter coupled to said emitter of said second input transistor and to said collector of said reference transistor.

16. A logic circuit comprising:
a first resistor having a first terminal coupled to a first power supply voltage terminal, and a second terminal;
a second resistor having a first terminal coupled to said first power supply voltage terminal, and a second terminal;
an MOS transistor having a first current electrode coupled to said second terminal of said first resistor, a gate for receiving a first input signal, and a second current electrode;
a first bipolar transistor having a collector coupled to said second terminal of said first resistor, a base for receiving a second input signal, and a collector;
a second bipolar transistor having a collector coupled to said second terminal of said second resistor for providing an output signal, a base for receiving a reference voltage, and an emitter coupled to said emitter of said first bipolar transistor;
a current source coupled to a second power supply voltage terminal;
series gating means coupled to said second terminal of said first resistor and to said emitters of said first and second bipolar transistors, for selectively diverting a current of said current source through either said second terminal of said first resistor of said emitters of said first and second bipolar transistors, in response to a third input signal; and
dropping means coupled to said current source and to said series gating means, for providing a voltage differential between said emitters of said first and second bipolar transistors, and said current source.

17. The logic circuit of claim 16 wherein said series gating means comprises:
a third bipolar transistor having a collector coupled to said second terminal of said first resistor, a base for receiving said second input signal, and an emitter;

a fourth bipolar transistor having a collector coupled to said emitter of said third bipolar transistor, a base for receiving a third input signal, and an emitter coupled to said dropping means; and a fifth bipolar transistor having a collector coupled to said emitters of said first and second bipolar transistors, a base for receiving a second reference voltage, and an emitter coupled to said emitter of said fourth bipolar transistor and to said current source.

18. A logic circuit comprising:

at least one emitter coupled pair of transistors, each emitter coupled pair of transistors after a first emitter coupled pair of transistor series gated with a previous emitter coupled pair of transistors, each at least one emitter coupled pair of transistors comprising:

a first transistor having a collector, a base for receiving an input signal, and an emitter;

second transistor having a collector, a base for receiving a reference voltage, and an emitter coupled to said emitter of said first transistor, collectors of said first and second transistors of said first emitter coupled pair of transistors respectively coupled through first and second transistors to a first power supply voltage terminal;

voltage dropping means for providing a voltage differential between first and second terminals thereof, said first terminal of said voltage dropping means coupled to emitters of said first and second transistors of a last of said at least one emitter coupled pair of transistors;

a current source for providing a current between said second terminal of said voltage dropping means and a second power supply voltage terminal; and an MOS transistor having a first current electrode coupled to said collector of said first transistor of one of said at least one emitter coupled pair of transistors, a gate for receiving a CMOS input signal, and a second current electrode coupled to said second terminal of said voltage dropping means.

19. A logic circuit comprising:

a first resistor having a first terminal coupled to a first power supply voltage terminal, and a second terminal for providing a first output signal;

a second resistor having a first terminal coupled to said first power supply voltage terminal, and a second terminal for providing a second output signal;

at least one input bipolar transistor, each of said at least one input bipolar transistor having a collector coupled to said second terminal of said first resistor, a base for receiving a respective CML-level input voltage, and an emitter;

a reference bipolar transistor having a collector coupled to said second terminal of said second resistor, a base for receiving a reference voltage, and an emitter coupled to said emitter of each of said at least one input bipolar transistor;

a current source coupled to a second power supply voltage terminal;

dropping means coupled to said current source, for providing a voltage differential between first and second terminals of said dropping means, said second terminal of said dropping means coupled to said current source;

series gating means coupled to said emitters of each of said at least one input bipolar transistors and said reference bipolar transistor and to said first terminal of said dropping means, for selectively diverting a current of said current source through either said first resistor or said emitters of said at least one input bipolar transistor and said reference bipolar transistor, in response to at least one ECL-level input signal; and at least one MOS transistor, each of said at least one MOS transistor having a first current electrode coupled to said series gating means, a gate for receiving a CMOS-level input voltage, and a second current electrode coupled to said current source.

* * * * *